United States Patent [19]

Nagumo et al.

[11] Patent Number: 4,785,332
[45] Date of Patent: Nov. 15, 1988

[54] PRESSURIZING IMAGE FORMING APPARATUS

[75] Inventors: Akihiko Nagumo; Minoru Ishikawa, both of Kanagawa, Japan

[73] Assignee: Fuji Photo Film Co., Ltd., Kanagawa, Japan

[21] Appl. No.: 37,902

[22] Filed: Apr. 13, 1987

[30] Foreign Application Priority Data

Apr. 16, 1986 [JP] Japan ................................ 61-87702

[51] Int. Cl.⁴ ...................... G03B 27/52; G03C 5/16
[52] U.S. Cl. .................................. 355/27; 250/319; 250/318
[58] Field of Search .............. 355/27, 79; 358/303; 250/318, 319

[56] References Cited

U.S. PATENT DOCUMENTS 4,620,096 10/1986 Takehara et al. ................. 250/319

Primary Examiner—L. T. Hix
Assistant Examiner—D. Rutledge
Attorney, Agent, or Firm—Sughrue, Mion, Zinn, Macpeak & Seas

[57] ABSTRACT

A pressurizing image forming apparatus makes use of a photo- and pressure-sensitive heat-developable material including a substrate and a layer formed on the substrate from a heat-developable material which enables the developed image to be fixed by the application of pressure. The image on the exposed photosensitive material is developed by application of heat and then fixed by application of pressure onto an image receiving layer on the photosensitive material itself or a separate image-receiving sheet. The fixing of the image is effected by intermittant application of impact pressure by cooperation between an impact pressurizing means; and platen means disposed to oppose the impact pressurizing means.

4 Claims, 2 Drawing Sheets

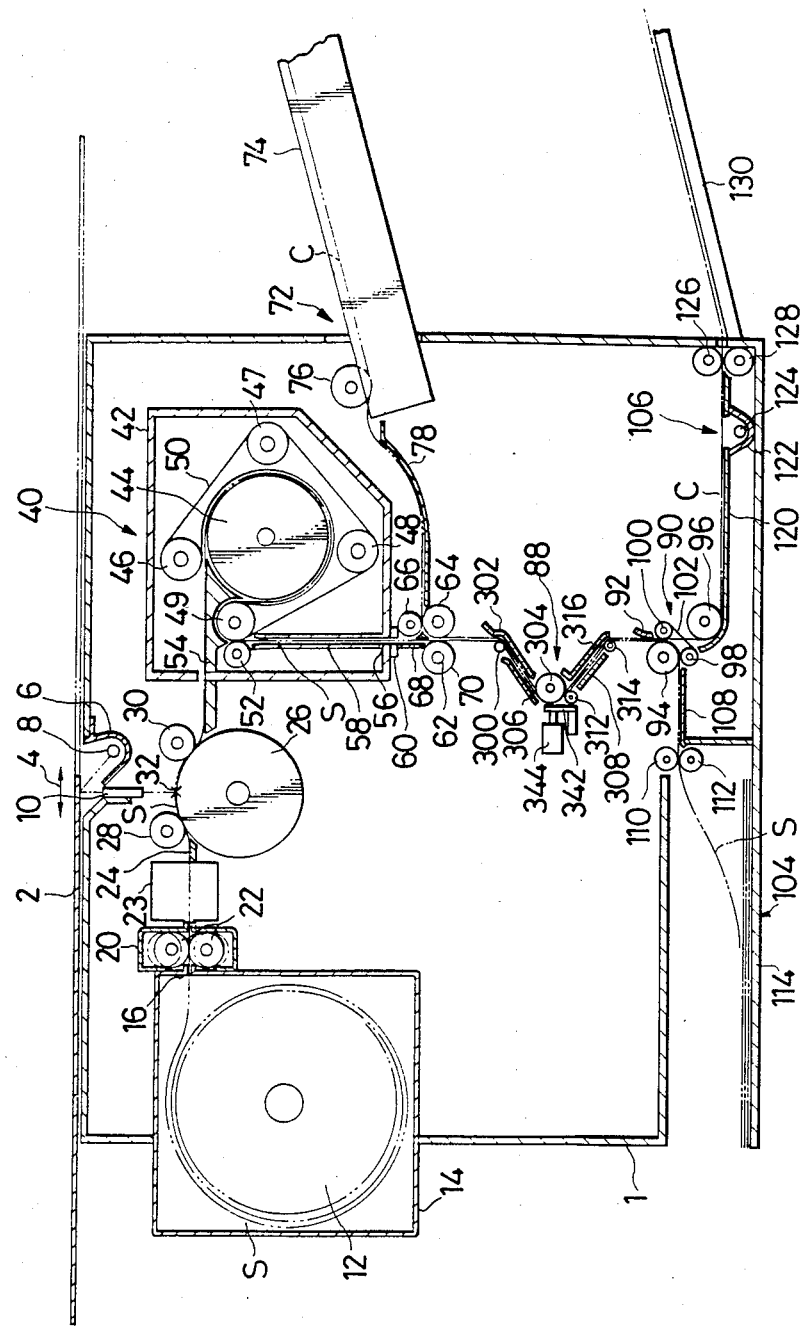

PRESSURIZING IMAGE FORMING APPARATUS

BACKGROUND OF THE INVENTION

The present invention relates to a pressurizing image forming apparatus which makes use of a photo- and pressure-sensitive heat-developable material having a substrate and a layer formed on the substrate from a substance which is photosensitive and developable by application of heat and capable of fixing the developed image by application of pressure. More particularly, the present invention is concerned with a pressurizing image forming apparatus which fixes, by application of pressure, an image which has been formed on the heat-developable material of the type mentioned above through exposure and developed by application of heat.

An image recording material employing microcapsules containing a photosensitive composition has been known. An example of such a recording material is disclosed in Japanese Patent Laid-open No. 179,836/1982. This recording material has a substrate which carries capsules made of a synthetic polymeric resin and containing a vinyl compound, a photopolymerization initiator and a coloring precursor.

In recording an image using this recording material, the material is first exposed so that the microcapsules are hardened in conformity with the form of the image. Then, as the recording material is pressed, the microcapsules which have not been hardened are ruptured so as to release the coloring agent precursor, thus forming a color image. This image recording system provides a high quality of the recorded image with a dry-type simple processing, but suffers from a disadvantage in that the photosensitivity is much smaller as compared with the system which makes use of silver halide.

Under this circumstance, the present applicant has proposed, in the specification of Japanese Patent Laid-open No. 275742/1986, a novel recording material which has a high photosensitivity and which ensures a high quality of the recorded image with a simple dry-type process. This recording material is a photo- and pressure-sensitive heat-developable material constituted by a carrier and a layer formed on the surface of the carrier, the layer containing at least a photosensitive silver halide, reducing agent, polymerizable compound and a color image forming substance, wherein the polymerizable compound and the color image forming substance are confined in common microcapsules.

An image recording method which makes use of this photo- and pressure-sensitive heat-developable material is disclosed in the specification of Japanese Patent Laid-open No. 278849/1986 filed by the same applicant. According to this method, the heat-developable material is first exposed so that a latent image is formed thereon in conformity with the image to be recorded. Then, the material is heated for development so that the polymerizable compound in the area where the latent image exists is polymerized to produce a polymeric compound, thus thermally setting the microcapsules. Then, the material is superposed on an image receiving material having an image receiving layer capable of receiving the color image forming substance, and is pressed to the image receiving material so that at least part of the microcapsules having no latent image is ruptured so as to transfer the color image forming substance to the image receiving material, thereby forming an image on the latter.

In order to obtain a clear image by the transfer of the heat-developed image from the photo- and pressure-sensitive heat-developable material to the image receiving material, it is essential that the heat-developable material be pressed uniformly onto the image receiving material under a given condition.

SUMMARY OF THE INVENTION

Accordingly, an object of the present invention is to provide a pressurizing image forming apparatus having a small-size and simple construction but yet capable of fixing the heat-developed image on the exposed photo- and pressure-sensitive heat-developable material to an image-receiving layer without fail, thus assuring a high quality of the formed image.

To this end, according to an aspect of the present invention, there is provided a pressurizing image forming apparatus of the type which makes use of a photo- and pressure-sensitive heat-developable material including a substrate and a layer formed on the substrate from a heat-developable material which enables the developed image to be fixed by the application of pressure, so that the image on the exposed photosensitive material is developed by application of heat and then fixed by application of pressure, the apparatus comprising: impact pressurizing means; and platen means disposed to oppose the impact pressurizing means.

The photo- and pressure-sensitive heat-developable material in accordance with the present invention may be of the type which, as disclosed in the specification of Japanese Patent Laid-open No. 278849/1986 of the same applicant, transfers color image forming substances to an image-receiving material having an image-receiving layer, thus forming the image on the image-receiving layer. Alternatively, the photo-and pressure-sensitive heat-developable material may of the type in which, as disclosed in the specification of Japanese Patent Application No. 53881/1986 filed by the same applicant on Mar. 10, 1986, the image-receiving layer is formed on the photo- and pressure-sensitive heat-developable material itself, so that the color image is fixed on the photo- and pressure-sensitive heat-developable material without necessitating the use of a specific image-receiving material.

The above and other objects, features and advantages of the present invention will become clear from the following description when the same is read in conjunction with the accompanying drawings.

BRIEF DESCRIPTION OF THE DRAWINGS

FIG. 1 is an illustration of an image recording apparatus incorporating a pressurizing image forming apparatus in accordance with the present invention;

DESCRIPTION OF THE PREFERRED EMBODIMENTS

Figure 3:
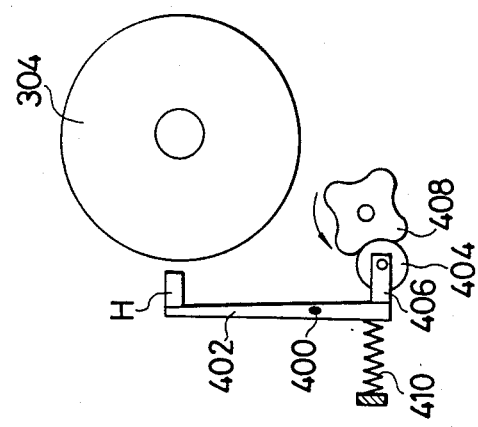
FIG. 3 is an illustration of an example of impact pressurizing means incorporated in the pressurizing image forming apparatus in accordance with the present invention.

An image recording apparatus incorporating a pressurizing image forming apparatus embodying the present invention will be described hereinunder.

The embodiment which will be mentioned in the following description is of the type which makes use of a photo- and pressure-sensitive heat-developable material adapted for transferring a developed image to a separate image-receiving material.

As shown in sectional-view in FIG. 1, the image recording apparatus incorporating a pressurizing image forming apparatus of the invention has a housing 1 on the upper surface of which is disposed an original supporting glass plate 2 for reciprocating movement in the direction of an arrow 4. Namely, the glass plate 2 carries an original with its image side directed downward and moves between the position illustrated by full line and a position illustrated by an imaginary line.

An illuminating lamp 8 for illuminating the original and provided with a reflector mirror 6 is placed under the glass plate 2. A fiber lens array 10 is adapted for projecting the image on the original onto a photo- and pressure-sensitive heat-developable material S (referred to as "photosensitive material", hereinafter).

A cartridge 14 accommodating a roll 12 of the photosensitive material S is detachably secured to one side of the housing 1. A pair of extraction rolls 22, 22, disposed at a photosensitive material outlet 16 in the cartidge 14 are received in a magazine connecting dark box 20. These rolls 22, 22 are adapted for extracting the photosensitive material by a predetermined length in a predetermined time. When approached by the leading end of the photosensitive material S, the extraction rolls 22, 22 are moved away from each other as indicated by imaginary lines so as not to impede the passage of the photosensitive material S. A cutter unit 23 for cutting the photosensitive material S, as well as a guide plate 24, is disposed downstream of the dark box 20 as viewed in the direction of movement of the photosensitive material S.

A supporting roll 26 for supporting exposed photosensitive material, as well as a pair of nip rolls 28, 30 pressed thereon, is disposed downstream of the guide plate 24. The photosensitive material S guided by the guide plate 24 is held in close contact with the supporting roller 26 by the nip rollers 28 and 30. The portion of the photosensitive material between these nip rolls 28 and 30 is exposed to the image on the original through the fiber lens array 10.

A heat-developing device 40 for heat-developing an image on the exposed photosensitive material S is disposed downstream of the supporting roll 26. The heat-developing device 40 has a heat-insulating developing housing 42, a heating roller 44 disposed in the housing 42 and adapted to be heated to about 120° C., an endless belt supported by four support rolls 46, 47, 48 and 49 and wound around the heating roll 44 through an angle of about 270°, and a nip roll 52 pressed onto the support roll 46.

The developing device 40 further has a guide device 54 for guiding the photosensitive material S from the support roll 26 onto the heating roll 44 and for separating the photosensitive material S from the heating roll 44 after heat-development. The developing device 40 also has a vertical guide device 58 which guides the photosensitive material S after development and fed by the support roll 49 and the nip roll 52 towards an outlet 56. A sensor 60 for sensing the leading end of the photosensitive material is provided at the outlet 56.

A superposing device 70 is disposed immediately below the outlet 56. The superposing device 70 includes a pair of pressing rolls 62, 64, a nip roll 66 pressed onto the pressing roll 64, and a guide member 68 which guides the photosensitive material S towards the nip between the pressing rolls 62 and 64.

An image receiving sheet supply device 72 is disposed at one side of the superposing device 70. The image receiving sheet supply device 72 includes an image receiving sheet supply cassette 74 detachably mounted on the housing 1 so as to project therefrom, an image receiving sheet supply roll 76 for extracting the image receiving sheet C from the cassette 74, and a guide plate 78 which guides the extracted image receiving sheet C towards the nip between the pressing roll 64 and the nip roll 66. The image receiving sheet C has a width about 6 mm smaller than that of the photosensitive material S. The superposing device 70 is adapted to superpose the image receiving sheet C and the photosensitive material S such that their longitudinal axes are aligned with each other, i.e., such that the image receiving sheet C is centralized with respect to the photosensitive material S in the widthwise direction.

Figure 2:
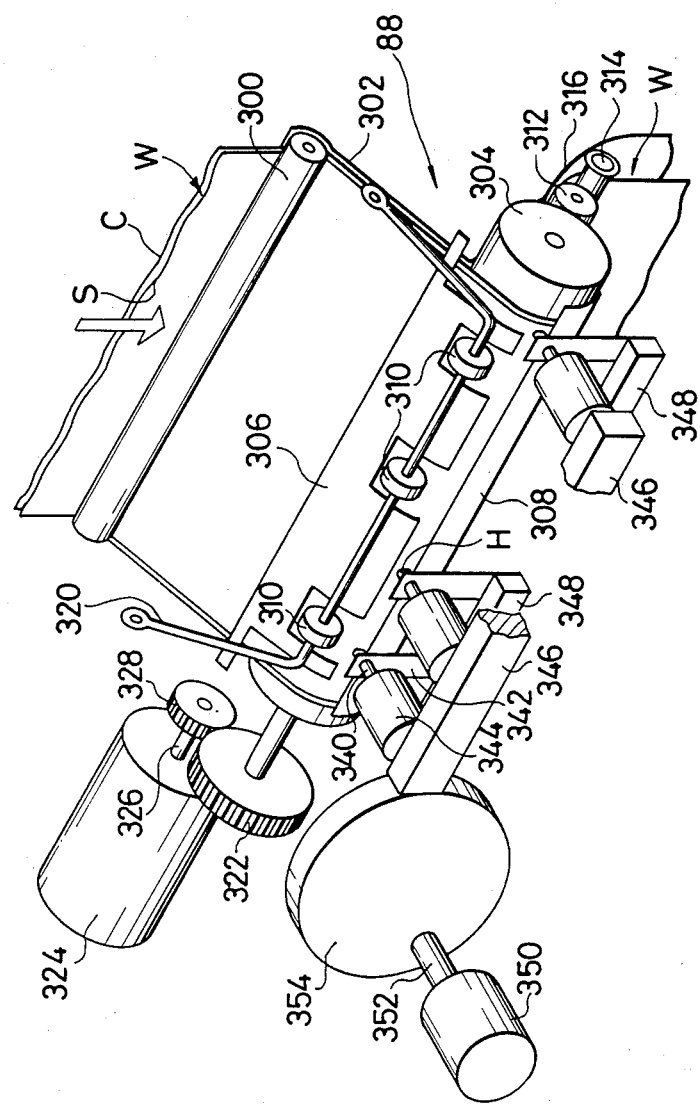
FIG. 2 is a perspective view of a pressurizing image forming apparatus embodying the present invention.

A pressurizing image forming apparatus 88 is disposed below the superposing device 70. The pressurizing image forming apparatus 88 is intended for pressing the photosensitive material S and the image-receiving material C superposed on each other (hereinafter referred to as "superposed sheet W"). The pressurizing image forming apparatus 88 includes, as shown in FIGS. 1 and 2, a conveyor roll 300 for changing the direction of convey of the superposed sheet W, a guide plate 302 for cooperation with the conveyor roll 300, a pressurizing roll 304 and a pair of guide plates 306, 308 for cooperation with the roll 304, a plurality of pressing rolls 310 for pressing the superposed sheet W onto the pressurizing roll 304, a nip roll 312 for cooperation with the pressurizing roll 304 in clamping the superposed sheet W therebetween, and a conveyor roll 314 and a cooperating guide plate 316 for changing the direction of convey of the superposed sheet W coming from the nip roll 312. The pressing rolls 310 are carried by a substantially U-shaped shaft member 320 which in turn is supported on the housing 1 (omitted from FIG. 2).

The pressurizing image forming apparatus 88 further has an impact pressurizing means. The impact pressurizing means includes a plurality of solenoid coils 344 with plungers 340 which are provided on their ends with leaf springs 342 having impact heads H. The solenoid coils 344 are supported by a common solenoid coil support member 346 and the leaf springs 342 are supported by a common leaf spring support member 348. The solenoid coil support member 346 and the leaf spring support member 348 are integrated to form a single member which also constitutes a part of the impact pressurizing means. The integral member composed of the solenoid coil support member 346 and the leaf spring support member 348 is urged in the direction parallel to the axis of the pressurizing roll 304, i.e., to the left and right as viewed in FIG. 2, by an urging member (not shown), so as to be movable along rails (not shown). The urging means operates to normally hold the solenoid support member 346 in contact with an eccentric cam 354 secured to the shaft 352 of a scanning motor 350.

The pressurizing roller 304 which serves as a platen is provided on one end thereof with a drive gear 322 which engages with a gear 328 fixed to the output shaft 326 of a feed motor 324. Each of the impact heads H is constituted by a single wire or a bundle of a plurality of wires. The surface of the impact head H contacting the superposed sheet W on the pressurizing roll 304 has a circular or an oval form.

In operation, as the superposed sheet W is fed to the pressurizing roll 304 and nipped between this roll 304 and the nip roll 312, the solenoid coils 344 are energized to attract and release the leaf springs 342 on the plungers 340, so that the superposed sheet W on the pressurizing roll 304 is locally pressurized by the impact heads H. On the other hand, the control system (not shown) controls the operation of the feed motor 324 and the scanning motor 350 in a manner which will be explained hereinunder. Namely, the scanning motor 350 operates continuously so that the eccentric cam 354 continuously rotates to cause the solenoid coil support member 346 to be reciprocatingly moved by a stroke which is substantially equal to the pitch at which the solenoid coils 344 are arranged. Meanwhile, the feed motor 324 operates intermittently so as to feed the superposed sheet W by a distance which is equal to the width of the area pressurized by the impact head H, each time the scanning of one line by the forward or backward stroking of the solenoid coils 344 is ceased, whereby the whole of the image on the photosensitive material S is transferred to the image-receiving sheet C.

A photosensitive material separating device 90 disposed under the pressurizing image forming apparatus 88 includes a guide member 92, a first feed roll 94, a second feed roll 96, and a separation belt 102 which is wound around the guide rolls 98 and 100 so as to be pressed only to the photosensitive material S at each end of the first feed roll 94.

A photosensitive material disposal section 104 is disposed at one side of the separation device 90, while a fixing device 106 is disposed on the other side of the same. The disposal section 104 includes a guide member 108, a pair of feed rolls 110, 112, and a disposal box 114, and is adapted to send the photosensitive material S from the separation device 90 into the disposal box 114 by the operation of the feed rollers 110, 112.

The fixing device 106 includes a guide member 120, an ultraviolet illuminating lamp 124 with a reflector 122, and a pair of feed rolls 126, 128. The fixing device 106 is adapted to irradiate the image receiving sheet C coming from the separation device 90 past the guide member 120 with ultraviolet rays for 5 seconds thereby fixing the image.

A delivery tray 130 for receiving the image receiving sheet C after the fixing is disposed downstream from the fixing device 106 so as to project from the housing 1.

The image recording apparatus further has a controller (not shown) to which are operatively connected the lighting lamp 8, cutter unit 23, original supporting glass plate 2, sensor 60 for sensing the leading end of the photosensitive material, and the superposing device 70. The controller is adapted to control a series of operations which will be described hereinunder.

When the apparatus is in the preparatory stage for recording an image, the photosensitive material S is set such that its leading end is positioned in the vicinity of the cutter unit 23 or within the dark box 20.

Then, as the copy start button (not shown) is depressed, the photosensitive material feed roll 22 operates to feed the photosensitive material S and the lighting lamp 8 lights up to illuminate the original immediately before the leading end of the photosensitive material reaches a position 32.

When the leading end of the photosensitive material S has reached the position 32, the original supporting glass plate 2 is moved and the photosensitive material S is fed in synchronism therewith so that the image on the original is projected onto the photosensitive material thus exposing the latter. After the photosensitive material S is fed by a distance equal to the length of the original in the moving direction, the cutter device 23 operates to cut the photosensitive material S.

The photosensitive material S thus exposed and then cut is supplied to the heat developing device 40 where it is pressed by the endless belt 50 onto the heating roller 44 which is maintained at about 120° C., whereby the image formed by the exposure is developed. Then, the sensor 60 senses that the leading end of the photosensitive material S after development has passes the outlet 56.

Meanwhile, the image receiving sheet supply device 72 starts to operate in response to the pressing of the start button or, in synchronism with the start of exposure, so as to feed the image receiving sheet C until the leading end of the image receiving sheet C is brought into the nip between the pressing roll 64 and the nip roll 66.

The superposing device 70 then operates to superpose the image receiving sheet C and the photosensitive material S such that the image receiving sheet C is centralized with respect to the photosensitive material S in the widthwise direction while the leading end of the image receiving sheet C is aligned with that of the photosensitive material S or several millimeters ahead thereof. The device 70 then feeds the superposed sheet members to the pressurizing image forming apparatus 88 where both sheet members are pressed to each other at a predetermined pressure, e.g., 200 kg/cm² applied by the impact pressurizing means, so that the image is transferred to the image receiving sheet C.

After the transfer of the image, the photosensitive material S is separated from the image receiving sheet C by the belt 102 in the separation device 90 and is forwarded to the disposal section 104. Meanwhile, the image receiving sheet C carrying the transferred image is fed to the fixing device 106 where it is irradiated with ultraviolet rays for 5 seconds whereby the image is fixed. The image receiving sheet C is then sent to the delivery tray 130 by the feed rollers 126 and 128.

The illuminating lamp 8 along with reflecting mirror 6 may be of any type capable of emitting radiation rays including visible rays. For instance, a stroboscope tube, a flash lamp, a tungsten lamp, a mercury lamp, a halogen lamp such as an iodine lamp, a xenon lamp, a laser light source, a CRT light source, a plasma light source, a fluorescent lamp or a light-emitting diode can be used as the lighting lamp 8. It is also possible to use a combination of a micro-shutter array making use of an LCD (Liquid Crystal Diode) or a PLZT (lead zirconium titanate doped with lanthanum) and a linear light source or a planar light source.

In the described embodiment, the exposure of the photosensitive material S is effected by directly projecting the original image on the material S through the fiber lens array 10. This, however, is not exclusive and the fiber lens array 10 may be substituted by other suitable means such as a spherical lens. It is also possible to expose the photosensitive material S indirectly through an image electric signal, by making use of a CRT, FOT (Fiber Optic Tube), LCA (Liquid Crystal Array), electro-optical element array. a combination of a laser, modulator and a scanner, or a combination of an LED and a scanner. In such a case, it is possible to effect on the image signal various editorial processings such as gradation correction, color correction and magnification or contraction of the projected image.

In the described embodiment, the scanning of the original image is conducted by moving both the original and the photosensitive material, while stationing the optical system. This, however, is not exclusive and the scanning may be effected by moving either one of the original and the photosensitive material and the optical system.

The heating roll 44 in the heat developing device 40 also is not exclusive, and may be substituted by a suitable other heating device such as a heating belt, a thermal head having an array of a heat-generating element, electric heating, or a device for applying a microwave or infrared rays. When the photosensitive material S is a specific one, the heating may be effected by eddy currents which are generated by electromagnetic induction. It is even possible to use a heating bath of a liquid which is inactive to the photosensitive material, e.g., a fluoro-liquid, as the means for heating. In these cases, the heating temperature generally ranges between 80° and 200° C., preferably between 100° and 160° C.

The arrangement also may be such that the image receiving sheet is superposed to the photosensitive material S before the development and the development is effected on the photosensitive material S with the image receiving sheet C superposed thereon, followed by the pressure-transfer of the developed image, although in the described embodiment the image receiving sheet C is superposed to the photosensitive material S after the development.

Another example of the impact pressurizing means in the pressurizing image forming apparatus will be explained hereinunder with specific reference to FIG. 3. An impact head H is provided on one end of a lever 402 having a fulcrum 400. The impact head is disposed so as to oppose the pressurizing roll 304. On the other hand, a support member 406 having a follower roller 404 is provided on the other ends of the lever 402. The other end of the lever 402 is urged by a spring 410 so that the follower roller 404 is pressed onto the rotary cam 408. As shown in FIG. 3, the rotary cam 408 is provided with a concaved portion and a convexed portion and is rotated by a motor which is not shown, with the follower roller 404 moving reciprocatingly so as to follow up the contour of the rotary cam 408. In consequence, the impact head H is moved reciprocatingly into and out of contact with the pressurizing roll 304 whereby the sheet W is locally pressurized by the impact head H.

Although a single impact head H has been described, the impact pressurizing means may incorporate a multiplicity of impact heads arrayed along a line parallel to the axis of the pressurizing roll 304, and the array is shifted to cover the entire length of each line, thus effecting the transfer of the line image by application of pressure, as in the case of the embodiment described before in connection with FIG. 2.

It is to be noted also that the array of the impact heads H may be constituted by a plurality of heads H arranged in the circumferential direction of the pressurizing roll 304, i.e., in the direction of line-feed of the laminated sheet W, such that the array is moved along the axis of the pressurizing roll 304 so as to effect transfer of the image over a plurality of lines at one time, in contrast to the foregoing embodiments in which the impact head array is constituted by impact heads H which are disposed in the direction of the axis of the pressurizing roll 304.

As has been described, according to the present invention, the application of pressure for the purpose of the transfer of the developed image to an image receiving layer on the photosensitive material itself or the image-receiving sheet superposed thereon is effected by an impact pressurizing means which pressurizes the photosensitive material or the photosensitive material and the image-receiving sheet superposed thereon, in such a manner to scan the entire area of these material sheets, whereby the whole region is uniformly pressurized. Furthermore, the area of the contact portion of each impact head can be freely adjusted so as to realize a high impact pressure with a simple construction, thus attaining a high efficiency of image formation by application of pressure. In addition, the apparatus of the present invention is free from problems such as wrinkling of the photosensitive material and the image-receiving sheet, since the pressure is applied only intermittently to these materials.

The invention has thus been illustrated and described with reference to specific embodiments, however, it should be noted that the invention is in no way limited to the details of the illustrated structures but changes and modifications may be made without departing from the scope of the appended claims.

We claim:

1. A pressurizing image forming apparatus of the type which makes use of a photo- and pressure-sensitive heat-developable material including a substrate and a layer formed on said substrate from a heat-developable material which enables the developed image to be fixed by the application of pressure, at least part of said heat-developable material being contained in common microcapsules, so that the image on the exposed photosensitive material is developed by application of heat and then fixed by application of pressure, said apparatus comprising:
   impact pressurizing means for uniformly fixing the developed image; and
   platen means disposed to oppose said impact pressurizing means.

2. A pressurizing image forming apparatus according to claim 1, wherein said impact pressurizing means includes solenoid coils, leaf springs associated with said solenoid coils and impact heads supported by said leaf springs.

3. A pressurizing image forming apparatus according to claim 1, wherein said impact pressurizing means includes cams, members engaging with said cams and movable reciprocatingly and impact heads carried by said members.

4. A pressurizing image forming apparatus according to claim 1, further comprising:
   feed motor means, coupled to said platen means, for causing intermittent movemement thereof.

* * * * *